United States Patent
Shank et al.

(10) Patent No.: US 10,720,494 B2
(45) Date of Patent: Jul. 21, 2020

(54) FIELD-EFFECT TRANSISTORS WITH AIRGAPS

(71) Applicant: GLOBALFOUNDRIES Inc., Grand Cayman (KY)

(72) Inventors: Steven M. Shank, Jericho, VT (US); Cameron Luce, Colchester, VT (US); Pernell Dongmo, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/876,530

(22) Filed: Jan. 22, 2018

(65) Prior Publication Data
US 2019/0229184 A1 Jul. 25, 2019

(51) Int. Cl.
*H01L 29/06* (2006.01)
*H01L 29/08* (2006.01)
*H01L 29/66* (2006.01)
*H01L 29/78* (2006.01)
*H01L 29/49* (2006.01)
(Continued)

(52) U.S. Cl.
CPC .... *H01L 29/0649* (2013.01); *H01L 21/02532* (2013.01); *H01L 21/02636* (2013.01); *H01L 21/3065* (2013.01); *H01L 21/764* (2013.01); *H01L 21/76224* (2013.01); *H01L 29/0688* (2013.01); *H01L 29/0847* (2013.01); *H01L 29/66568* (2013.01); *H01L 29/78* (2013.01); *H01L 21/0217* (2013.01); *H01L 21/02271* (2013.01); *H01L 21/3081* (2013.01);
(Continued)

(58) Field of Classification Search
CPC ............. H01L 29/0649; H01L 29/0688; H01L 29/0847; H01L 29/66568; H01L 29/78; H01L 29/4991; H01L 21/76289
See application file for complete search history.

(56) References Cited

U.S. PATENT DOCUMENTS 6,190,981 B1 * 2/2001 Lin ..................... H01L 29/4983
257/E21.437
6,285,072 B1 * 9/2001 Maeda ................ H01L 21/7624
257/370
(Continued)

FOREIGN PATENT DOCUMENTS

CN 105261587 A * 1/2016
JP 2016225353 A * 12/2016

OTHER PUBLICATIONS

Adusumilli et al., "Sealed Cavity Structures with a Planar Surface" filed Jan. 22, 2018 as U.S. Appl. No. 15/876,727.
(Continued)

*Primary Examiner* — Ida M Soward
(74) *Attorney, Agent, or Firm* — Thompson Hine LLP; Anthony Canale

(57) ABSTRACT

Structures that integrate airgaps with a field-effect transistor and methods for forming a field-effect transistor with integrated airgaps. A first semiconductor layer is formed on a substrate, and a second semiconductor layer is formed over the first semiconductor layer. A source/drain region of a field-effect transistor is formed in the second semiconductor layer. An airgap is located in the first semiconductor layer. The airgap is arranged in a vertical direction between the source/drain region and the substrate.

20 Claims, 7 Drawing Sheets

(51) Int. Cl.
*H01L 21/76* (2006.01)
*H01L 21/02* (2006.01)
*H01L 21/764* (2006.01)
*H01L 21/3065* (2006.01)
*H01L 21/762* (2006.01)
*H01L 21/308* (2006.01)
*H01L 21/768* (2006.01)

(52) U.S. Cl.
CPC .... *H01L 21/3086* (2013.01); *H01L 21/76829* (2013.01); *H01L 29/4991* (2013.01)

(56) References Cited

U.S. PATENT DOCUMENTS

| | | | | |
|---|---|---|---|---|
| 6,476,429 | B2* | 11/2002 | Baba | H01L 21/324 257/273 |
| 6,746,923 | B2* | 6/2004 | Skotnicki | H01L 29/66666 257/E21.41 |
| 7,015,147 | B2 | 3/2006 | Lee et al. | |
| 7,427,803 | B2 | 9/2008 | Chao et al. | |
| 7,429,504 | B2* | 9/2008 | Kim | H01L 29/0653 257/E29.021 |
| 7,659,178 | B2* | 2/2010 | Cheng | H01L 29/66772 438/409 |
| 7,714,385 | B2* | 5/2010 | Tokano | H01L 29/0634 257/341 |
| 7,781,828 | B2* | 8/2010 | Stecher | H01L 23/36 257/329 |
| 8,106,468 | B2* | 1/2012 | Wang | H01L 29/0649 257/276 |
| 8,569,825 | B2* | 10/2013 | Iinuma | H01L 27/11582 257/314 |
| 9,035,377 | B2* | 5/2015 | Sato | H01L 29/7802 257/329 |
| 9,048,284 | B2 | 6/2015 | McPartlin et al. | |
| 9,530,686 | B1* | 12/2016 | Bidal | H01L 21/7624 |
| 9,536,997 | B1* | 1/2017 | Yokoyama | H01L 29/407 |
| 9,570,556 | B1* | 2/2017 | Lee | H01L 29/0649 |
| 9,691,899 | B2* | 6/2017 | Zhu | H01L 21/82341 |
| 9,711,608 | B1* | 7/2017 | Duriez | H01L 29/42392 |
| 9,865,504 | B2* | 1/2018 | Lee | H01L 27/0886 |
| 10,393,960 | B1* | 8/2019 | Shank | G02B 6/122 |
| 2004/0217434 | A1* | 11/2004 | Lee | H01L 21/76224 257/412 |
| 2008/0073747 | A1 | 3/2008 | Chao et al. | |
| 2009/0029513 | A1* | 1/2009 | Blanchard | H01L 21/26533 438/269 |
| 2011/0169081 | A1* | 7/2011 | Ishikawa | H01L 21/02381 257/341 |
| 2013/0320459 | A1* | 12/2013 | Shue | H01L 29/0649 257/392 |
| 2015/0137185 | A1* | 5/2015 | Camillo-Castillo | H01L 29/7371 257/197 |
| 2015/0236142 | A1* | 8/2015 | Laven | H01L 21/2254 257/66 |
| 2016/0093523 | A1 | 3/2016 | Jaffe et al. | |
| 2016/0172250 | A1* | 6/2016 | Shue | H01L 21/76283 438/295 |
| 2016/0268368 | A1* | 9/2016 | Matsuda | H01L 29/0634 |
| 2017/0133375 | A1* | 5/2017 | Fung | H01L 21/823807 |
| 2018/0083128 | A1* | 3/2018 | Yokoyama | H01L 29/1095 |
| 2018/0108675 | A1* | 4/2018 | Schmidt | H01L 29/0649 |
| 2018/0151717 | A1* | 5/2018 | Cheng | H01L 29/1054 |
| 2018/0182902 | A1* | 6/2018 | Liu | H01H 59/0009 |
| 2018/0233557 | A1* | 8/2018 | Cheng | H01L 29/7848 |
| 2019/0067122 | A1* | 2/2019 | Cheng | H01L 21/823807 |
| 2019/0067125 | A1* | 2/2019 | Chiang | H01L 29/66439 |
| 2019/0067441 | A1* | 2/2019 | Yang | H01L 29/4991 |
| 2019/0244933 | A1* | 8/2019 | Or-Bach | H01L 25/167 |

OTHER PUBLICATIONS

Anthony K. Stamper, et al., "Radio Frequency Switches With Air Gap Structures", U.S. Appl. No. 15/645,655, filed Jul. 10, 2017.

Michel J. Abou-Khalil et al., "Field-Effect Transistors With a Body Pedestal", U.S. Appl. No. 15/584,121, filed May 2, 2017.

Hashimoto et al., "A Study on Suppressing Crosstalk Through a Thick SOI Substrate and Deep Trench Isolation", IEEE Journal of the Electron Devices Society, Vol. 1, No. 7, Jul. 2013.

Ohguro et al., "High performance digital-analog mixed device on an Si substrate with resistivity beyond 1 k/spl Omega/cm", Technical Digest, Electron Devices Meeting, Dec. 10-13, 2000.

Jurczak, et al., "Silicon-on-Nothing (SON)—an Innovative Process for Advanced CMOS", IEEE Transactions on Electron Devices, vol. 47, No. 11, Nov. 2000.

Loubet et al., "Si1-xGex/Si Selective Etch with HCl for Thin Si-Channel Transistors Integration", Extended Abstracts of the 2007 International Conference on Solid State Devices and Materials, Tsukuba, 2007, pp. 716-717.

* cited by examiner

FIELD-EFFECT TRANSISTORS WITH AIRGAPS

BACKGROUND

The present invention relates to semiconductor device fabrication and integrated circuits and, more specifically, to structures that integrate airgaps with a field-effect transistor and methods for forming a field-effect transistor with integrated airgaps.

Complementary metal-oxide semiconductor (CMOS) circuitry is utilized in mobile communication devices (e.g., laptops, cellular phones, tablets, etc.) to handle wireless high frequency signals transmitted to and/or received by the mobile communication devices. The circuitry may include a low noise amplifier and a high frequency switch that allows for high frequency signals received by an antenna to be routed from the low noise amplifier to other chip circuitry and for high frequency signals to be routed from a power amplifier to the antenna. The high frequency switch may include a stack or bank of field-effect transistors formed by CMOS processes. Field-effect transistors fabricated on a bulk substrate may exhibit poor linearity due to, for example, non-linear electric fields on the substrate and poor intermodulation properties. Semiconductor-on-insulator (SOI) substrates may mitigate some of these issues, but are costly in comparison with bulk substrates.

Improved structures that integrate airgaps with a field-effect transistor and methods for forming a field-effect transistor with integrated airgaps are needed.

SUMMARY

In an embodiment of the invention, a structure includes a first semiconductor layer on a substrate, a second semiconductor layer over the first semiconductor layer, and a field-effect transistor including a source/drain region in the second semiconductor layer. The structure further includes an airgap located in the first semiconductor layer. The airgap is arranged in a vertical direction between the source/drain region and the substrate.

In an embodiment of the invention, a method includes epitaxially growing a first semiconductor layer on a substrate, epitaxially growing a second semiconductor layer over the first semiconductor layer, and forming a source/drain region of a field-effect transistor in the second semiconductor layer. An airgap is formed in the first semiconductor layer, and is arranged in a vertical direction between the source/drain region and the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
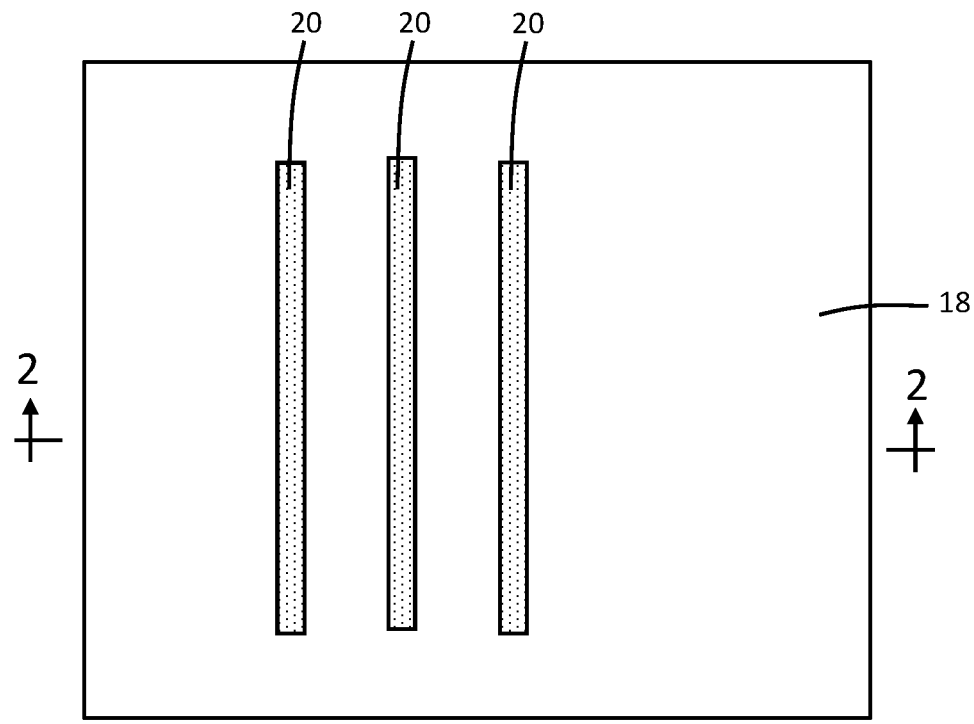
FIG. 1 is a top view of a structure at an initial fabrication stage of a processing method in accordance with embodiments of the invention.
Figure 2:
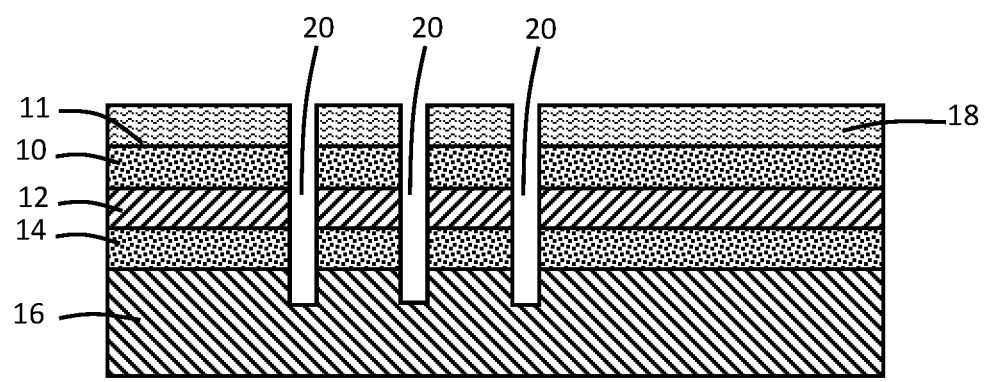
FIG. 2 is a cross-sectional view taken generally along line 2-2 in FIG. 1.

With reference to FIGS. 1, 2 and in accordance with embodiments of the invention, a semiconductor layer 10, a semiconductor layer 12, and a semiconductor layer 14 are formed in a layer stack on a substrate 16. The semiconductor layer 10 usable to form the devices of an integrated circuit with front-end-of-line (FEOL) processing may be composed of single-crystal silicon. The substrate 16 may be a bulk wafer comprised of single-crystal silicon, and the semiconductor layers 10 and 14 may also be comprised of single-crystal silicon. The semiconductor layer 14 is epitaxially grown over the substrate 16 using the substrate 16 as a growth seed and crystal structure template, the semiconductor layer 12 is epitaxially grown over the semiconductor layer 14 using the semiconductor layer 14 as a growth seed and crystal structure template, and the semiconductor layer 10 is epitaxially grown over the semiconductor layer 12 using the semiconductor layer 12 as a growth seed and crystal structure template.

The semiconductor layer 12 may be composed of a semiconductor material, such as silicon-germanium (SiGe), that can be etched selective to the semiconductor material (e.g., silicon) of the semiconductor layers 10 and 14 and also etched selective to the semiconductor material (e.g., silicon) of the substrate 16. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the semiconductor layer 12 may be composed of silicon-germanium with a germanium content ranging from twenty percent (20%) to thirty-five percent (35%), which etches at a higher rate than silicon.

A hardmask 18 is arranged over a top surface of the semiconductor layer 14. The material constituting the hardmask 18 may be chosen to etch selectively to the semiconductor materials constituting the substrate 16 and semiconductor layers 10, 12, and 14, and to be readily removed at a subsequent fabrication stage. The hardmask 18 may be composed of a dielectric material, such as silicon nitride ($Si_3N_4$) deposited by chemical vapor deposition (CVD).

The hardmask 18 is patterned using lithography and etching to form openings, and then used to form corresponding openings 20 that extend from a top surface 11 of the semiconductor layer 10 through the semiconductor layers 10, 12, and 14 and to a shallow depth into the substrate 16. The openings 20 may be formed using a directional etching process, such as reactive ion etching (ME), at the locations of the openings in the patterned hardmask 18. In an embodiment, the openings 20 may be trenches, and may have an aspect ratio of height-to-width that ranges from 4:1 to 8:1. The aspect ratio is chosen, at least in part, to promote closing and sealing of the openings 20 by pinch-off subsequently in the process flow. The openings 20 are arranged in parallel lines in one lateral direction and may be formed with a given pitch in the other lateral direction, and the number of openings 20 may differ from the number shown in the representative embodiment.

Figure 1A:
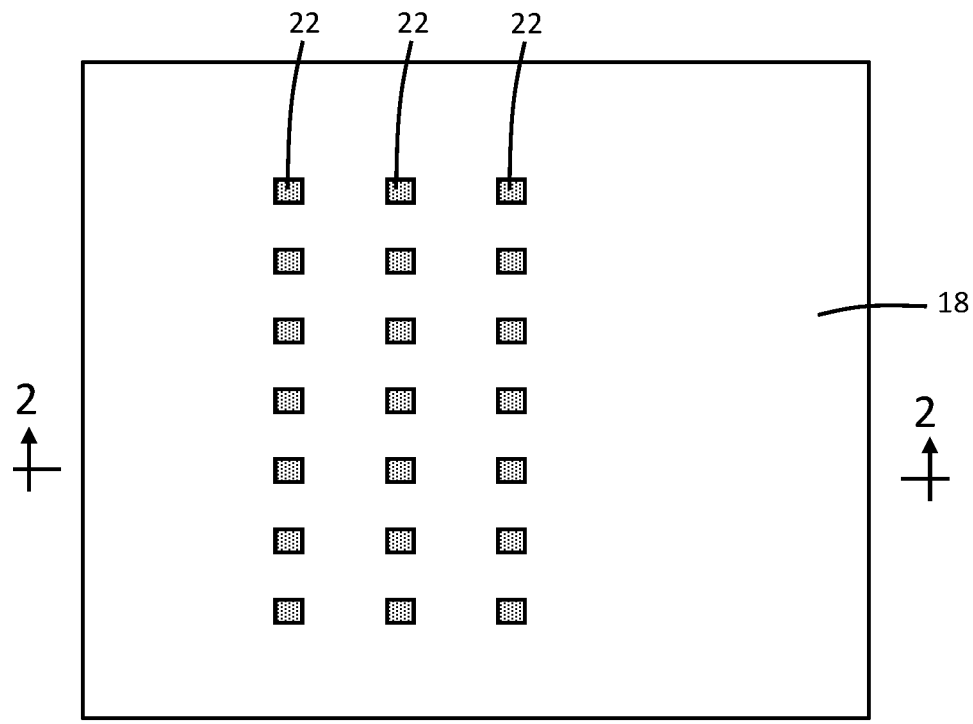
FIG. 1A is a top view of a structure at an initial fabrication stage of a processing method in accordance with alternative embodiments of the invention.

As shown in FIG. 1A and in accordance with alternative embodiments, openings 22 of different characteristics may be formed instead of openings 20. In an embodiment, the openings 22 may be vias extending from the top surface 11 of the semiconductor layer 10 through the semiconductor layers 10, 12, and 14 and to a shallow depth into the substrate 16. The openings 22 may have an aspect ratio of height-to-width that ranges from 4:1 to 8:1. The openings 22 are arranged in parallel rows, and the number of the openings 22 may vary depending on design parameters.

Figure 3:
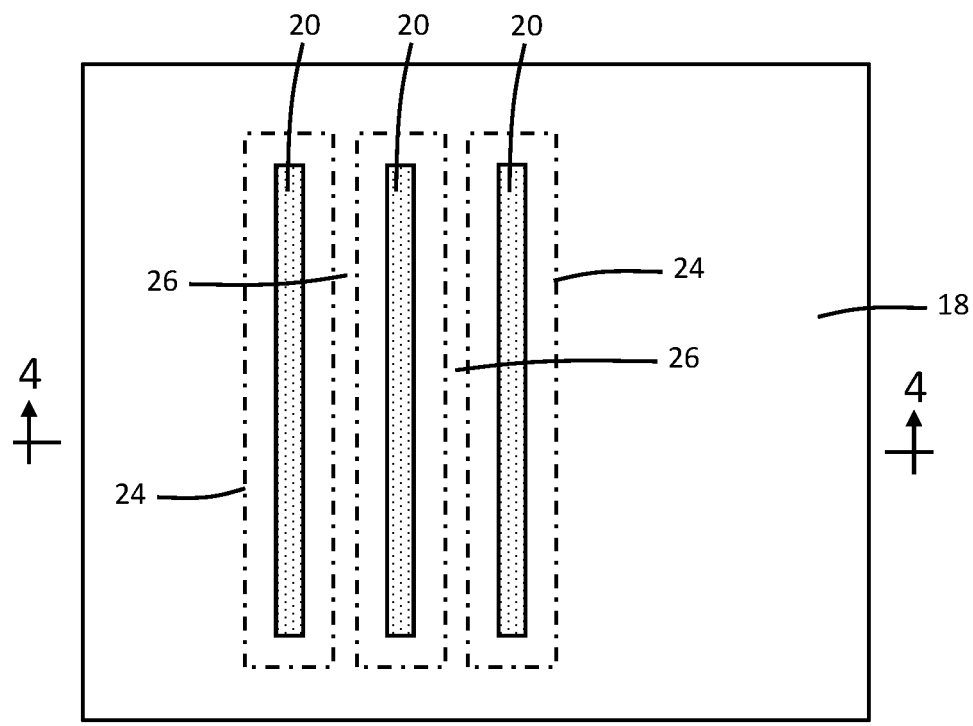
FIG. 3 is a top view of the structure at a fabrication stage subsequent to FIG. 1.
Figure 4:
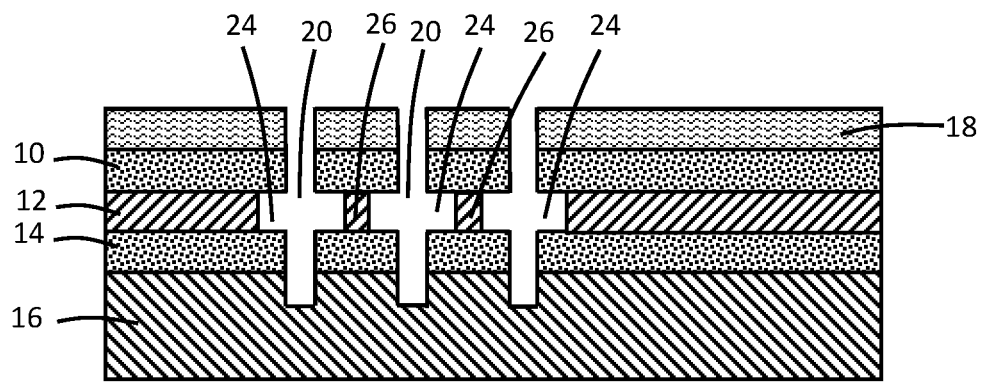
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage of the processing method, cavities 24 are formed that extend outwardly from the openings 20. The cavities 24 may be formed by laterally recessing the semiconductor layer 12 relative to the underlying semiconductor layer 14 and the overlying semiconductor layer 10 by performing an isotropic etching process. The cavities 24 are arranged in a vertical direction between the semiconductor layer 10 and the semiconductor layer 14, and extend laterally in a horizontal direction relative to the openings 20. The cavities 24, which are wider than the openings 20, may be symmetrical relative to a vertical centerline of the respective associated opening 20. If the semiconductor layers 10 and 14 are comprised of silicon and the semiconductor layer 12 is comprised of silicon-germanium, then an etch chemistry for a wet or dry isotropic etching process that removes silicon-germanium selective to silicon may be chosen. For example, a suitable etch chemistry to etch silicon-germanium selective to silicon may be, for example, hot ammonia ($NH_3$) and/or hydrochloric acid (HCl) vapor. Before performing the isotropic etching process, a thermal bake may be performed at an elevated temperature of, for example, 800° C. to remove native oxide from the exposed surfaces of the semiconductor layers 12 that is to be laterally recessed.

The etching process is controlled such that the semiconductor layer 12 is not completely removed between adjacent pairs of the cavities 24. Sections of the semiconductor layer 12 remain that form pedestals 26 that are arranged between adjacent pairs of cavities 24. The pedestals 26 have a parallel arrangement that is established by the parallel arrangement of the openings 20 and cavities 24. The pedestals 26 extend in a vertical direction from the semiconductor layer 14 to the semiconductor layer 10.

Figure 3A:
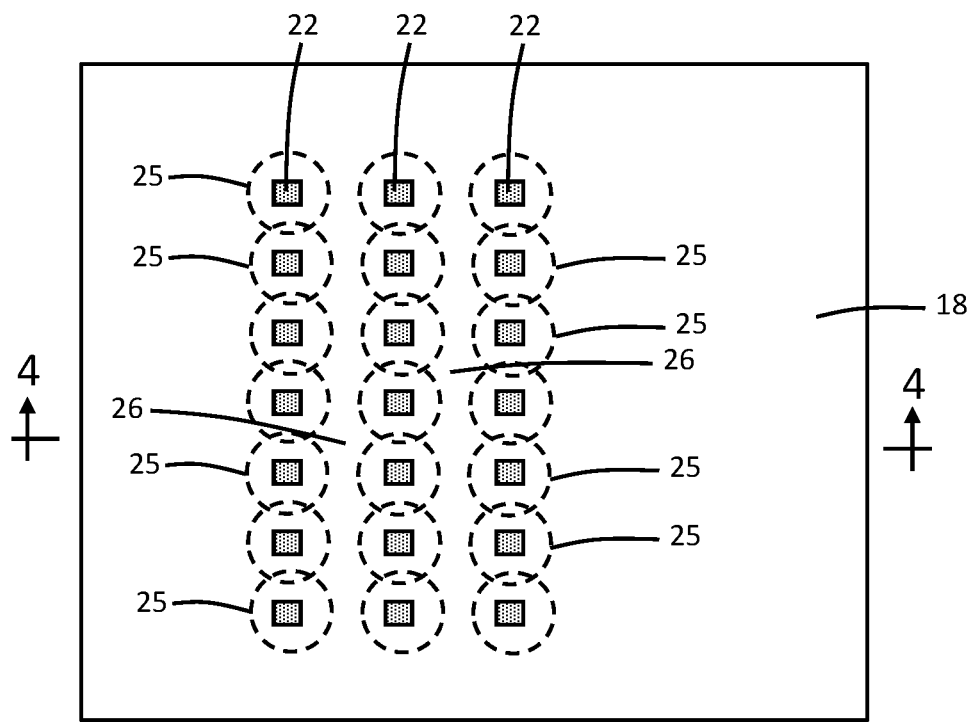
FIG. 3A is a top view of the structure at a fabrication stage subsequent to FIG. 1A.

As shown in FIG. 3A and in accordance with an alternative embodiment, cavities 25 of a different geometrical shape may be formed instead of cavities 24. The cavities 25 are centered about the openings 22 and are formed in the same manner as the cavities 24 with an isotropic etching process. The cavities 25 are arranged in parallel rows, and the pedestals 26 represent sections of the semiconductor layer 12 that remain between adjacent rows of the cavities 25. The arrangement of the cavities 25 reflects the pattern of the openings 22. The cavities 25 may overlap and merge during the isotropic etching process so long as the pedestals 26 are preserved by exerting control exerted over the isotropic etching process.

Figure 5:
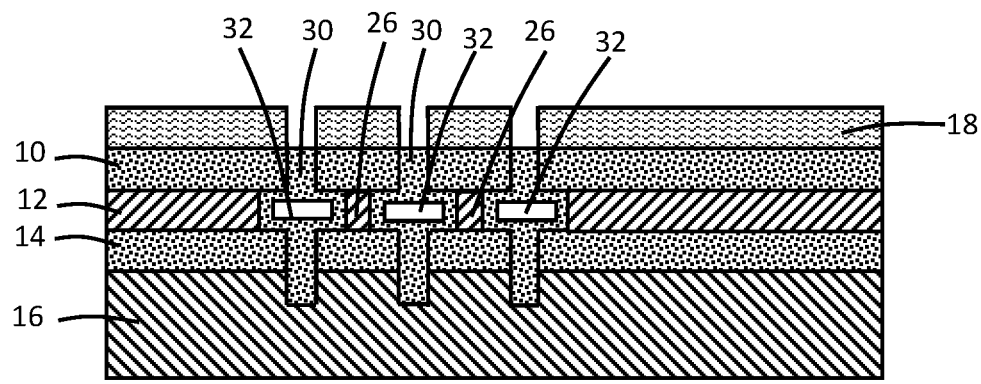
FIGS. 5 and 6 are cross-sectional views of the structure at successive fabrication stages subsequent to FIG. 4.

With reference to FIG. 5 in which like reference numerals refer to like features in FIGS. 3, 4 and at a subsequent fabrication stage of the processing method, the openings 20 above and below the cavities 24 are filled with sections of a layer 30 composed of a semiconductor material and the cavities 24 are partially filled by sections of the semiconductor layer 30. In an embodiment, the semiconductor layer 30 may be composed of an epitaxially-grown semiconductor material, such as silicon, that pinches off to seal and occlude the upper section of the openings 20 closest to the top surface 11 of the semiconductor layer 10. In an embodiment, the semiconductor layer 30 may be formed by a selective epitaxial growth (SEG) process in which semiconductor material nucleates for epitaxial growth on semiconductor surfaces, but does not nucleate for epitaxial growth from insulator surfaces (e.g., the hardmask 18). The semiconductor material of the semiconductor layer 30 grows from growth seeds provided by the exposed surfaces of the semiconductor layers 10, 12, and 14, and the substrate 16. The semiconductor layer 30 may be composed of the same semiconductor material as the semiconductor layers 10 and 14. In an alternative embodiment, the semiconductor layer 30 may have a composition that is a composite of the compositions of the semiconductor materials of the semiconductor layers 10, 12, and 14.

The semiconductor layer 30 coats the interior surfaces of the cavities 24 during deposition and, before the cavities 24 are completely filled by the semiconductor layer 30, the openings 20 pinch off above the cavities 24 of larger dimensions. The result is that airgaps 32 are trapped or formed inside the cavities 24 as respective portions of the cavities 24 that are unfilled by the semiconductor layer 30. The airgaps 32 are arranged in a vertical direction between the semiconductor layer 10 and the semiconductor layer 14.

The airgaps 32 may be characterized by a permittivity or dielectric constant of near unity (i.e., vacuum permittivity). The airgaps 32 may be filled by atmospheric air at or near atmospheric pressure, may be filled by another gas at or near atmospheric pressure, or may contain atmospheric air or another gas at a sub-atmospheric pressure (e.g., a partial vacuum). The reduced dielectric constant of the airgaps 32 reduces the capacitive coupling between device structures formed in the semiconductor layer 10 and the substrate 16.

In an embodiment, the deposition of the semiconductor layer 30 may be performed in the same process tool as the isotropic etching process forming the cavities 24. In the absence of an air break between different process tools that would otherwise form native oxide on semiconductor surfaces, the need for a high temperature bake (e.g., at 800° C.) to remove the native oxide, which would interfere with the isotropic etching process, would be obviated.

Figure 6:
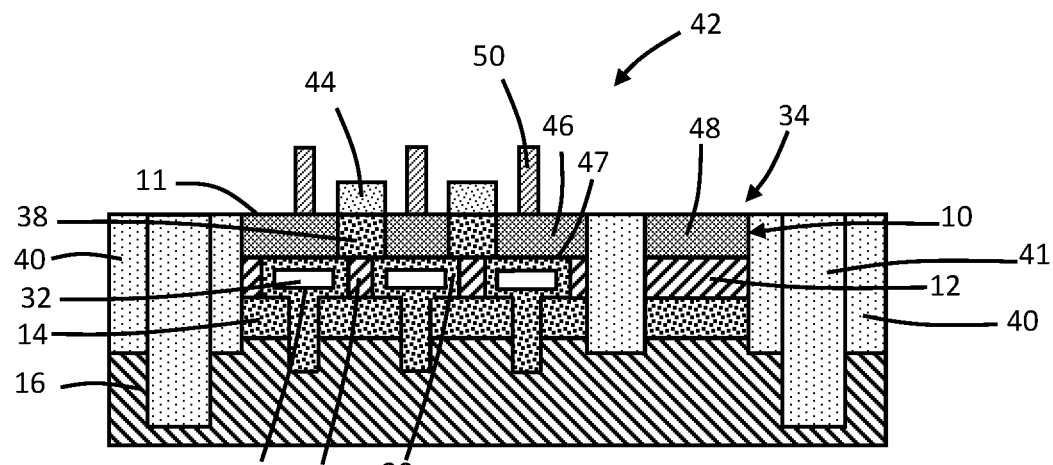

With reference to FIG. 6 in which like reference numerals refer to like features in FIG. 5 and at a subsequent fabrication stage of the processing method, the hardmask 18 is removed, and shallow trench isolation regions 40 are formed that surround a device region 34 of the semiconductor layer 10. The shallow trench isolation regions 40 extend from the top surface 11 of the semiconductor layer 10 through the semiconductor layers 10, 12, and 14 to a shallow depth into the substrate 16. The shallow trench isolation regions 40 may be composed of a dielectric material, such as an oxide of silicon (e.g., silicon dioxide ($SiO_2$)), deposited by chemical vapor deposition (CVD) into trenches etched by a masked etching process. A well 38 is formed in the semiconductor layer 10 and is arranged in a vertical direction above the airgaps 32. The well 38 may be formed by, for example, ion implantation. The well 38 may be part of a dual well or a triple well arrangement. The semiconductor material surrounding the airgaps 32 may be amorphized by implantation of heavy ions, such as argon ion, and then recrystallized to form polycrystalline semiconductor material that provides additional electrical isolation.

A device structure, generally indicated by reference numeral 42, may be formed by front-end-of-line (FEOL) processing using the device region 34. For example, the device structure 42 may be a switch field-effect transistor that includes multiple gate fingers 44 having a parallel arrangement in rows and connected together at one end. Each gate finger 44 may include a gate electrode and a gate dielectric formed by depositing a layer stack and patterning the layer stack with photolithography and etching. The gate electrode may be composed of a conductor, such as doped polycrystalline silicon (i.e., polysilicon), and the gate dielectric may be composed of an electrical insulator, such as silicon dioxide ($SiO_2$). The device structure 42 may include other elements such as source/drain regions 46, halo regions, and lightly doped drain (LDD) extensions, as well as non-conductive spacers (not shown) formed on the vertical sidewalls of the gate fingers 44. In an embodiment, the source/drain regions 46 may be doped with an n-type dopant (e.g., arsenic (As) or phosphorus (P)) selected from Group V of the Periodic Table to produce n-type conductivity, and the well 38 may be doped with ions of a p-type dopant (e.g., boron B)) selected from Group III of the Periodic Table to produce p-type conductivity.

A portion of the well 38 is arranged between the source/drain regions 46, and the well 38 provides a semiconductor body that is coupled with a body contact 48. The body contact 48 is doped to have the same conductivity type as the well 28, and may be heavily doped with the dopant.

The pedestals 26, which represent sections of the semiconductor layer 12 that are preserved following the isotropic etching process forming the cavities 24, are arranged in a vertical direction between the section of the well 38 between the source/drain regions 46 and the semiconductor layer 14. Each of the pedestals 26 is also arranged in a lateral direction between an adjacent pair of the airgaps 32. The gate fingers 44 are arranged over the pedestals 26 and are aligned parallel with the pedestals 26.

The airgaps 32 have a lower boundary 31 that is arranged in a vertical direction as the portion of the airgaps 32 separated by the greatest distance from the top surface 11 of the semiconductor layer 10. The source/drain regions 46 form a junction 47 with oppositely doped semiconductor material of the semiconductor layer 10, the semiconductor layer 12, and/or the epitaxial layer 30. In the representative embodiment, the junction 47 of the source/drain regions 46 is arranged in the vertical direction between the airgaps 32 and the top surface 11 of semiconductor layer 10 (i.e., completely above the airgaps 32). In alternative embodiments, the junction 47 of the source/drain regions 46 may be arranged in a vertical direction between a lower boundary 31 of the airgaps 32 and the top surface 11 of the semiconductor layer 10 (i.e., at least partially above the airgaps 32). If another well is added, the junction of the added well with the well 38 is arranged in a vertical direction between the lower boundary 31 of the airgaps 32 and the top surface 11 of the semiconductor layer 10 (i.e., at least partially above the airgaps 32). The result is that all p-n junctions of the device structure 42 (e.g., the junctions between the source/drain regions 46 and the intervening section of the well 38) are arranged at or above the lower boundary 31 of the airgaps 32.

After the device structure 42 is formed, deep trench isolation regions 41 may be formed that extend through the shallow trench isolation regions 40 to a shallow depth into the substrate 16. The deep trench isolation regions 41 may be formed by etching trenches and then filling the etched trenches with a dielectric material, such as silicon dioxide ($SiO_2$), that is deposited (e.g., by chemical vapor deposition (CVD)) and planarized with, for example, chemical mechanical polishing (CMP). The deep trench isolation regions 41 may include airgaps that are trapped during dielectric material filling.

Middle-of-line (MOL) and back-end-of-line (BEOL) processing follow, which includes formation of contacts 50 in an interlayer dielectric layer that extend to couple with the source/drain regions 46.

Figure 6A:
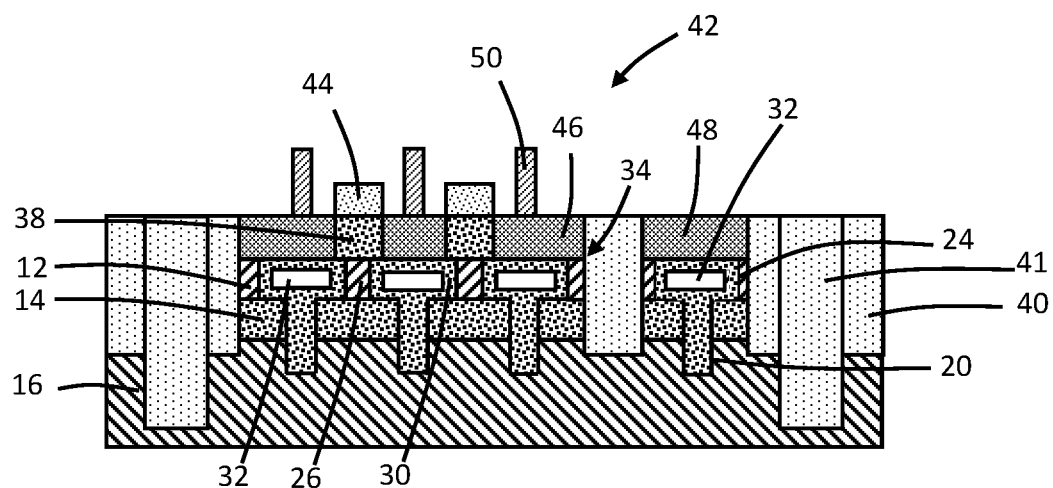
FIG. 6A is a cross-sectional view of a structure in accordance with alternative embodiments of the invention.

With reference to FIG. 6A in which like reference numerals refer to like features in FIG. 6 and in accordance with alternative embodiments of the invention, the structure may be modified to add another opening 20, as well as another cavity 24 and eventually another airgap 32 that is arranged in a vertical direction between the body contact 48 and the substrate 16. The additional opening 20 is formed when the openings 20 are formed in the device region 34, the additional cavity 24 is formed when the cavities 24 are formed in the device region 34, and the additional cavity 24 is partially filled by the semiconductor layer 30 to encapsulate the additional airgap 32. The semiconductor layer 30 also seals the additional opening 20 in a vertical direction above the additional airgap 32.

Figure 7:
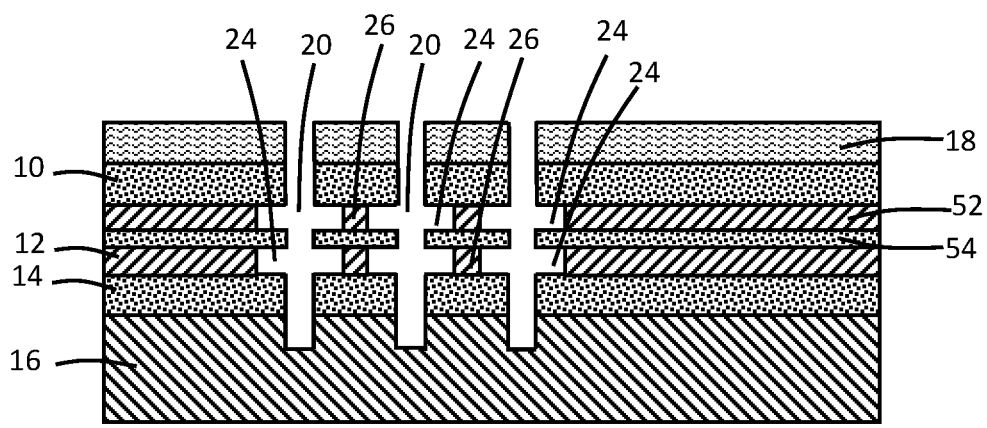
FIGS. 7 and 8 are cross-sectional views of a structure at successive fabrication stages of a processing method in accordance with alternative embodiments of the invention.

With reference to FIG. 7 in which like reference numerals refer to like features in FIG. 3 and in accordance with alternative embodiments of the invention, the layer stack formed on the substrate 16 may be expanded to include an additional semiconductor layer 52 and an additional semiconductor layer 54. The semiconductor layers 52 and 54 are both arranged in the vertical direction between the semiconductor layer 10 and the semiconductor layer 12. The semiconductor layer 54 may be composed of semiconductor material having the same composition as semiconductor layers 10 and 14. The semiconductor layer 52 may be composed of semiconductor material having the same composition as semiconductor layer 12 or, alternatively, a different composition with a similar etch selectivity.

The openings 20 also penetrate through the semiconductor layers 52, 54 and the semiconductor layer 52 is laterally recessed relative to the semiconductor layers 10, 14, and 54 by the isotropic etching process forming the cavities 24. The multiple recessed semiconductor layers 12 and 52 results in cavities 24 that have dual chambers in which one chamber is arranged in the vertical direction between the semiconductor layers 10 and 54, and another chamber is arranged in the vertical direction between the semiconductor layers 14 and 54. Due to the lateral recessing of its surrounding semiconductor layers 12 and 52 by the selective etching, the semiconductor layer 54 has tips or ends that project into the cavities 24 between the different chambers. The pedestals 26 have a tiered arrangement in which sections of the semiconductor layer 52 are also arranged between the different cavities 24 in the semiconductor layer 52.

Figure 8:
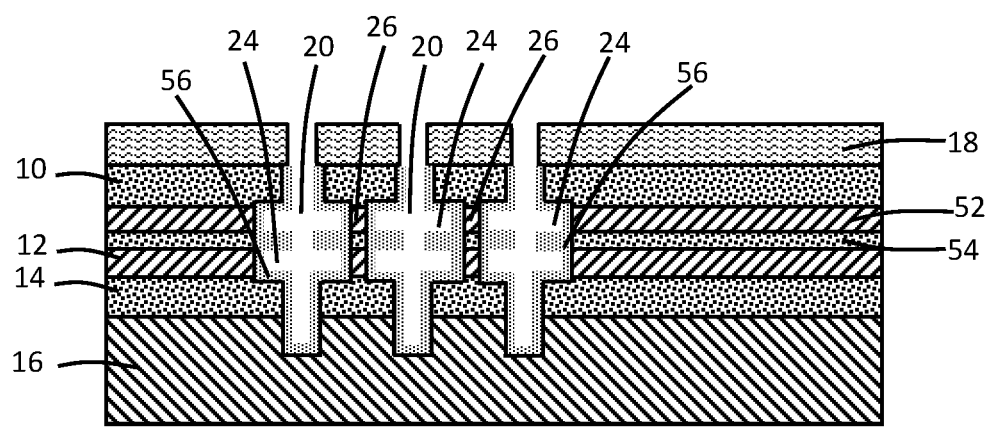

With reference to FIG. 8 in which like reference numerals refer to like features in FIG. 7 and at a subsequent fabrication stage of the processing method, an oxide layer 56 is formed on the surfaces of the semiconductor layers 10, 12, 14, 52, 54, and the substrate 16 by a thermal oxidation process. The thermal oxidation process, which consumes a thin surface layer of the semiconductor material of the semiconductor layers 10, 12, 14, 52, 54 on the surfaces bordering the cavities 24, is controlled such that the cavities 24 are enlarged without consuming the pedestals 26.

The oxide layer 56 may be subsequently stripped with, for example, a solution including hydrofluoric acid (HF), and the process flow may continue as described in connection with FIG. 5 by filling of the openings 20 with sections of the semiconductor layer 30 and simultaneously partially filling the cavities 24 to encapsulate the airgaps 32, followed by the formation of the well 38, shallow trench isolation regions 40, deep trench isolation regions 41, and device structure 42 as described in connection with FIG. 6. The height of the cavities 24 and airgaps 32 may be increased through the introduction of the additional semiconductor layers 52 and 54, and may be further increased through the introduction of additional pairs of semiconductor layers like semiconductor layers 52 and 54.

Figure 9:
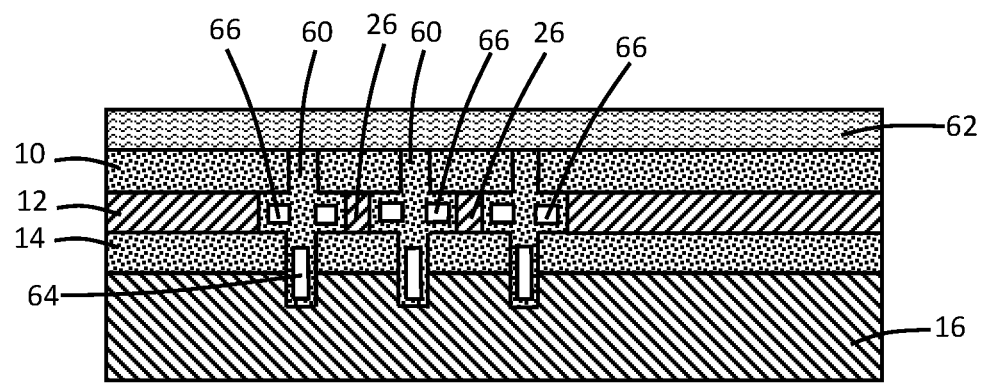
FIGS. 9 and 10 are cross-sectional views of structures in accordance with alternative embodiments of the invention.

With reference to FIG. 9 in which like reference numerals refer to like features in FIG. 3 and in accordance with alternative embodiments of the invention, the hardmask 18 is removed, and an epitaxial layer 60 may be formed in the openings 20 and cavities 24 in a different manner than used to form the semiconductor layer 30 (FIG. 5). Specifically, a thin conformal layer of a semiconductor material, such as silicon-germanium (SiGe), may be epitaxially grown as a liner on the surfaces of the semiconductor layers 10, 12, and 14 and substrate 16 bordering the openings 20 and cavities 24. The growth of the conformal layer does not pinch off the openings 20. A prebake may be performed at a temperature of 1000° C. to 1050° C. in a reducing atmosphere (e.g., hydrogen), which causes the conformal layer to reflow. An epitaxial layer 62, which may be composed of a different semiconductor material (e.g., silicon) than the conformal layer, may then be epitaxially grown and caused to reflow with a thermal process. The reflowed epitaxial layer 62 may combine with the conformal layer and form the epitaxial layer 60 inside the openings 22 and cavities 24. The epitaxial layer 62 also grows in the field on the top surface 11 of the semiconductor layer 10. In an embodiment, the epitaxial layer 62 may be grown at a temperature of 1000° C. to 1050° C., which is selected to cause the semiconductor material of the epitaxial layer 62 to reflow inside the openings 20 and cavities 24 and to combine with the conformal layer and form epitaxial layer 60. The epitaxial layer 60 seals the openings 20, and may be used for forming the device structure 42 in addition to or instead of semiconductor layer 10.

Airgaps 64 are encapsulated by the epitaxial layer 60 inside the openings 20 at a location vertically below the semiconductor layer 12. The airgaps 64 may be arranged in part within the substrate 16 and in part within the semiconductor layer 14 in the vertical direction. Airgaps 66 are encapsulated by the epitaxial layer 60 inside the cavities 24 at locations vertically below the semiconductor layer 12. The airgaps 66 are laterally displaced relative to the airgaps 64. The airgaps 64, 66 may have a different geometrical shape, such as an ovoid, than the cuboid shape shown in the representative embodiment. The process flow may continue with the formation of the well 38, shallow trench isolation regions 40, deep trench isolation regions 41, and device structure 42 as described in connection with FIG. 6.

Figure 10:
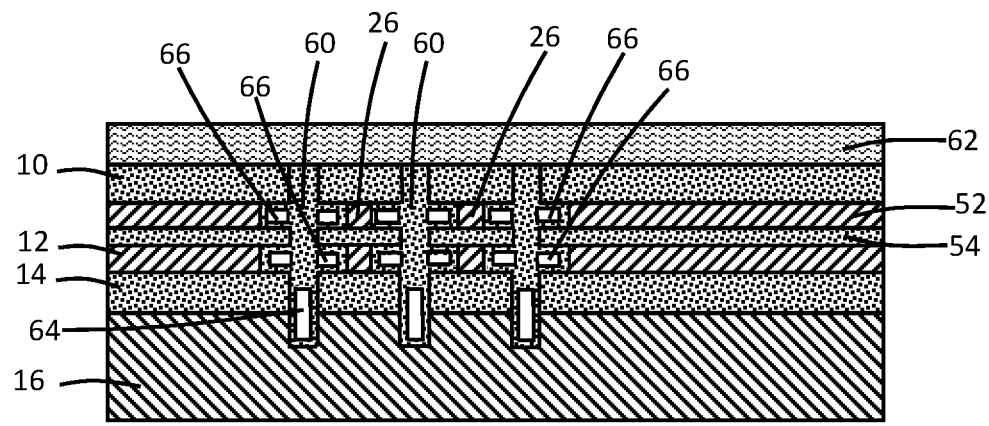
Figure 11:
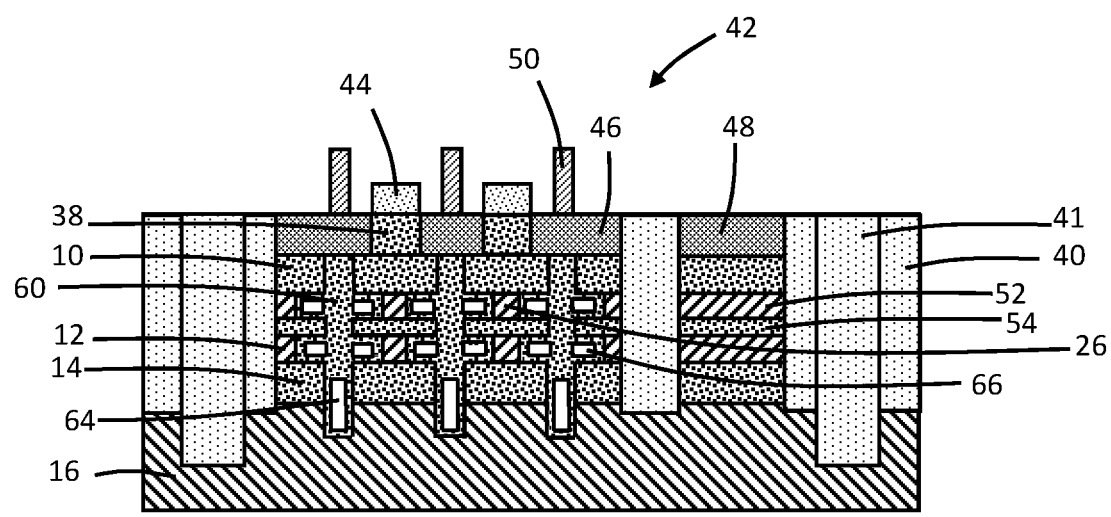
FIG. 11 is a cross-sectional view of the structure of FIG. 10 subsequent to the fabrication of the device structure.

With reference to FIG. 10 in which like reference numerals refer to like features in FIG. 7 and in accordance with alternative embodiments of the invention, the epitaxial layer 60 may be used to form the airgaps 64 and 66, as described in the context of FIG. 9, in connection with the layer stack that includes the semiconductor layers 52, 54. Some of the airgaps 66 are arranged at the level of the semiconductor layer 52 and other of the airgaps 66 are arranged at the level of the semiconductor layer 12. The process flow may continue with the formation of the well 38, shallow trench isolation regions 40, deep trench isolation regions 41, and device structure 42 as described in connection with FIG. 6 and as shown in FIG. 11.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product. For example, the field-effect transistor and/or handle wafer contact in the embodiments described herein may be used in a switch, a low noise amplifier, or a logic circuit.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first semiconductor layer on a substrate;
    a second semiconductor layer over the first semiconductor layer;
    a field-effect transistor including a first source/drain region in the second semiconductor layer;
    a first airgap in the first semiconductor layer, the first airgap positioned between the first source/drain region and the substrate, the first airgap arranged inside a cavity in the first semiconductor layer; and
an epitaxial layer arranged inside the cavity to surround the first airgap,
wherein the second semiconductor layer has a top surface, and the first source/drain region is positioned in the second semiconductor layer between the first airgap in the first semiconductor layer and the top surface of the second semiconductor layer.

2. The structure of claim 1 further comprising:
a well in the second semiconductor layer;
wherein the first source/drain region forms a p-n junction with the well in the first semiconductor layer, and the p-n junction is arranged above the first airgap and below the top surface of the second semiconductor layer.

3. The structure of claim 1 wherein the second semiconductor layer includes one or more openings extending from the cavity to the top surface of the second semiconductor layer, and the epitaxial layer fills the one or more openings in the second semiconductor layer.

4. The structure of claim 1 wherein the field-effect transistor includes a second source/drain region, and further comprising:
a second airgap in the first semiconductor layer, the second airgap positioned between the second source/drain region and the substrate, and the second airgap separated from the first airgap by a section of the first semiconductor layer.

5. The structure of claim 4 further comprising:
a third airgap arranged below the first airgap and the second airgap.

6. The structure of claim 5 wherein the third airgap is centered in a lateral direction relative to the first airgap and the second airgap.

7. The structure of claim 4 wherein the field-effect transistor includes a gate finger positioned over the section of the first semiconductor layer.

8. The structure of claim 1 wherein the field-effect transistor includes a second source/drain region, the second semiconductor layer includes a semiconductor body arranged in part between the first source/drain region and the second source/drain region, and further comprising:
a body contact region in the second semiconductor layer, the body contact region coupled with the semiconductor body; and
a second airgap in the first semiconductor layer, the second airgap arranged at least in part between the body contact region and the substrate.

9. The structure of claim 1 further comprising:
a third semiconductor layer and a fourth semiconductor layer between the first semiconductor layer and the second semiconductor layer,
wherein the cavity is further located in the third semiconductor layer and the fourth semiconductor layer.

10. A structure comprising:
a first semiconductor layer on a substrate;
a second semiconductor layer over the first semiconductor layer;
a third semiconductor layer positioned between the first semiconductor layer and the second semiconductor layer;
a fourth semiconductor layer positioned between the third semiconductor layer and the first semiconductor layer;
a field-effect transistor including a first source/drain region in the second semiconductor layer;

a first airgap in the first semiconductor layer, the first airgap positioned between the first source/drain region and the substrate; and
a second airgap in the third semiconductor layer, the second airgap positioned between the first source/drain region and the first airgap,
wherein the second semiconductor layer has a top surface, and the first source/drain region is positioned in the second semiconductor layer between the first airgap in the first semiconductor layer and the top surface of the second semiconductor layer.

11. The structure of claim 10 further comprising:
a well in the second semiconductor layer;
wherein the first source/drain region forms a p-n junction with the well in the first semiconductor layer, and the p-n junction is arranged above the first airgap and below the top surface of the second semiconductor layer.

12. The structure of claim 10 wherein the first airgap is arranged inside a first cavity in the first semiconductor layer, the second airgap is arranged inside a second cavity in the third semiconductor layer, and further comprising:
an epitaxial layer arranged inside the first cavity to surround the first airgap and inside the second cavity to surround the second airgap.

13. The structure of claim 12 wherein the second semiconductor layer includes one or more openings extending from the first cavity to the top surface of the second semiconductor layer, and the epitaxial layer fills the one or more openings in the second semiconductor layer.

14. A method comprising:
forming a first semiconductor layer on a substrate;
forming a second semiconductor layer over the first semiconductor layer;
forming a first source/drain region of a field-effect transistor in the second semiconductor layer;
forming a first airgap in the first semiconductor layer; and
forming an epitaxial layer arranged inside a cavity in the first semiconductor layer to surround the first airgap,
wherein the first airgap is positioned between the first source/drain region and the substrate, the second semiconductor layer has a top surface, and the first source/drain region is positioned in the second semiconductor layer between the first airgap in the first semiconductor layer and the top surface of the second semiconductor layer.

15. The method of claim 14 further comprising:
forming a well in the second semiconductor layer,
wherein the first source/drain region forms a p-n junction with the well in the first semiconductor layer, and the p-n junction is arranged above the first airgap and below the top surface of the second semiconductor layer.

16. The method of claim 14 wherein the field-effect transistor includes a second source/drain region, and further comprising:
forming a second airgap in the first semiconductor layer concurrently with forming the first airgap,
wherein the second airgap is positioned between the second source/drain region and the substrate.

17. The method of claim 14 further comprising:
etching one or more openings extending through the first semiconductor layer and the second semiconductor layer; and
recessing the first semiconductor layer relative to each of the one or more openings with an isotropic etching process that removes the first semiconductor layer selective to the second semiconductor layer and thereby forms the cavity.

18. The method of claim 17 wherein the epitaxial layer fills the one or more openings in the second semiconductor layer.

19. The method of claim 14 wherein the field-effect transistor includes a second source/drain region, and further comprising:

forming a second airgap in the first semiconductor layer, wherein the second airgap is positioned between the first source/drain region and the substrate, and the second airgap is separated from the first airgap by a section of the first semiconductor layer.

20. The method of claim 19 further comprising:

forming a third airgap arranged below the first airgap and the second airgap.

* * * * *